US011078780B2

(12) United States Patent
Gooneratne et al.

(10) Patent No.: US 11,078,780 B2
(45) Date of Patent: Aug. 3, 2021

(54) SYSTEMS AND METHODS FOR ACTUATING DOWNHOLE DEVICES AND ENABLING DRILLING WORKFLOWS FROM THE SURFACE

(71) Applicant: Saudi Arabian Oil Company, Dhahran (SA)

(72) Inventors: Chinthaka Pasan Gooneratne, Dhahran (SA); Jothibasu Ramasamy, Dhahran (SA); Bodong Li, Dhahran (SA); Mohammad Saud Al-Badran, Dhahran (SA); Timothy Eric Moellendick, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 16/720,159

(22) Filed: Dec. 19, 2019

(65) Prior Publication Data
US 2021/0189868 A1 Jun. 24, 2021

(51) Int. Cl.
*E21B 47/13* (2012.01)
*E21B 33/122* (2006.01)
(Continued)

(52) U.S. Cl.
CPC ............ *E21B 47/13* (2020.05); *E21B 33/122* (2013.01); *E21B 33/1208* (2013.01); *G08C 25/04* (2013.01)

(58) Field of Classification Search
CPC ......... G08C 25/04; E21B 47/12; E21B 47/13; E21B 33/1208; E21B 33/122
See application file for complete search history.

(56) References Cited

U.S. PATENT DOCUMENTS

| 4,760,882 A | 8/1988 | Novak |
|---|---|---|
| 7,273,102 B2 | 9/2007 | Sheffield |

(Continued)

FOREIGN PATENT DOCUMENTS

| CA | 2894558 A1 | 8/2014 |
|---|---|---|
| CA | 2929482 A1 | 6/2015 |

(Continued)

OTHER PUBLICATIONS

International Search Report and Written Opinion for International Application No. PCT/US2020/065736, report dated Mar. 25, 2021; pp. 1-13.

(Continued)

*Primary Examiner* — Franklin D Balseca
(74) *Attorney, Agent, or Firm* — Bracewell LLP; Constance G. Rhebergen; Vivek P. Shankam

(57) ABSTRACT

Systems and methods for actuation of downhole devices are disclosed. The system includes a first cylindrical pipe having one or more first materials attached to an outer surface of the first cylindrical pipe, a second cylindrical pipe co-axial with the first cylindrical pipe and having a diameter greater than the first cylindrical pipe, the second cylindrical pipe comprising one or more second materials disposed on an inner surface of the second cylindrical pipe, wherein the first materials generate one or more signals when the first materials come in contact with the second materials, and a digital logic circuit configured to receive the one or more signals as input, and generate an output based on the input, the output configured for actuation of the downhole devices.

32 Claims, 11 Drawing Sheets

(51) Int. Cl.
*G08C 25/04* (2006.01)
*E21B 33/12* (2006.01)

(56) References Cited

U.S. PATENT DOCUMENTS

| | | |
|---|---|---|
| 7,503,398 B2 | 3/2009 | Logiudice et al. |
| 7,510,001 B2 | 3/2009 | Spring et al. |
| 7,931,091 B2 | 4/2011 | Bailey et al. |
| 8,016,036 B2 | 9/2011 | Kirkwood et al. |
| 8,122,950 B2 | 2/2012 | Daniel et al. |
| 8,215,393 B2 | 7/2012 | Mackay et al. |
| 8,284,075 B2 | 10/2012 | Fincher et al. |
| 8,394,464 B2 | 3/2013 | Bailey et al. |
| 8,639,186 B2 | 1/2014 | Ayers |
| 8,800,880 B2 | 8/2014 | Christiansen |
| 9,115,573 B2 | 8/2015 | Purkis et al. |
| 9,382,769 B2 | 7/2016 | Wilson et al. |
| 9,488,046 B2 | 11/2016 | Purkis |
| 9,506,326 B2 | 11/2016 | Hay et al. |
| 9,567,819 B2 | 2/2017 | Cavender et al. |
| 9,574,439 B2 * | 2/2017 | Joseph .............. E21B 47/09 |
| 9,677,371 B2 | 6/2017 | Richards et al. |
| 9,822,611 B2 | 11/2017 | Delzell et al. |
| 9,890,319 B2 | 2/2018 | Ezell et al. |
| 9,970,246 B2 | 5/2018 | Price Hoelscher et al. |
| 10,000,681 B2 | 6/2018 | Livanec et al. |
| 10,047,604 B2 | 8/2018 | Graves et al. |
| 10,053,978 B2 | 8/2018 | Hay et al. |
| 2009/0090514 A1 | 4/2009 | Bailey et al. |
| 2010/0263867 A1 | 10/2010 | Horton et al. |
| 2011/0048697 A1 | 3/2011 | Lewis et al. |
| 2011/0284245 A1 | 11/2011 | Crandall et al. |
| 2013/0118733 A1 | 5/2013 | Kumar |
| 2013/0126164 A1 | 5/2013 | Sweatman et al. |
| 2013/0284518 A1 | 10/2013 | Wu et al. |
| 2014/0318806 A1 | 10/2014 | Machocki |
| 2015/0114646 A1 | 4/2015 | Price Hoelscher et al. |
| 2016/0053572 A1 | 2/2016 | Snoswell |
| 2016/0164437 A1 | 6/2016 | Kim et al. |
| 2016/0244654 A1 | 8/2016 | Way et al. |
| 2017/0015887 A1 | 1/2017 | De Stefano et al. |
| 2017/0159363 A1 | 6/2017 | Lazarev et al. |
| 2017/0183938 A1 | 6/2017 | Inglis |
| 2017/0247607 A1 | 8/2017 | Hundt |
| 2017/0292371 A1 | 10/2017 | Hay |
| 2017/0293044 A1 | 10/2017 | Gilstrap et al. |
| 2017/0322341 A1 | 11/2017 | Galliano et al. |
| 2017/0342826 A1 | 11/2017 | Wilson et al. |
| 2018/0030824 A1 | 2/2018 | Roberson et al. |
| 2018/0051700 A1 | 2/2018 | Sheth et al. |
| 2018/0082090 A1 | 3/2018 | Roberson et al. |
| 2018/0262127 A1 * | 9/2018 | Gooneratne ............ E21B 47/12 |
| 2019/0031951 A1 | 1/2019 | Johnson et al. |
| 2019/0093459 A1 | 3/2019 | Mau et al. |
| 2020/0208510 A1 * | 7/2020 | Guijt .................... G01V 1/40 |

FOREIGN PATENT DOCUMENTS

| | | |
|---|---|---|
| DE | 60305190 T2 | 11/2006 |
| EP | 2501032 A2 | 9/2012 |
| WO | 2011041562 A2 | 4/2011 |
| WO | 2012122178 A2 | 9/2012 |
| WO | 2012154473 A1 | 11/2012 |
| WO | 2015040241 | 3/2015 |
| WO | 2016043979 A1 | 3/2016 |
| WO | 2018013312 A1 | 1/2018 |
| WO | 2019005556 A1 | 1/2019 |

OTHER PUBLICATIONS

International Search Report and Written Opinion for Internaltion Application No. PCT/US2020/066221 report dated Mar. 29, 2021; pp. 1-14.

International Search Report and Written Opinion for International Application No. PCT/US2019/037602 report dated Apr. 13, 2021; pp. 1-13.

International Search Report and Written Opinion for International Application No. PCT/US2020/065808 report dated Apr. 15, 2021; pp. 1-14.

* cited by examiner

SYSTEMS AND METHODS FOR ACTUATING DOWNHOLE DEVICES AND ENABLING DRILLING WORKFLOWS FROM THE SURFACE

BACKGROUND

1. Field

Embodiments relate to a method for downhole communication and an apparatus for remote actuation of a downhole tool. In particular, but not exclusively, the disclosure relates to a method for downhole communication with, and an apparatus for actuation of, tools in an oil or gas well.

2. Description of Related Art

Logging tools, such as wireline logging tools, MWD (measurement while drilling) and LWD (logging while drilling) are used to obtain information about the geological formations both inside and surrounding limited wellbore regions. The information obtained by these downhole measurement tools can be used to make various interpretations about the formations and conditions inside a well, which can then be used to make and revise drilling programs. Wireline and MWD or LWD tools have the ability to measure, either directly or indirectly, a wide range of measurements such as wellbore trajectory, and formation characteristics including resistivity, density, porosity, lithology, mineralogy, geological structure, permeability as well as geomechanical and fluid properties. Wireline tools have been used for many decades to obtain downhole wellbore and formation data.

In a wireline logging operation, a tool which contains several sensors are lowered into a well and data is obtained at various points inside a well until the tool reaches the bottom. Data is also obtained when the wireline tool is pulled out of the well. If the wireline logging tool is to be run for example after drilling an open hole, first, the drilling assembly has to be pulled out of hole. Then, the wireline operation also takes time, depending on the well depth and resolution of the data, to be run in the hole. Once the wireline logging is finished it has to be pulled out of the hole and the drilling assembly has to be run in hole again. Wireline logging is expensive due to the time spent on performing a wireline logging operation as well as the expensive sensors and packaging. During wireline operation, fluid in the wellbore typically remains static and the wellbore condition has to be in a favorable condition, if several logging runs are required, a dedicated wiper trip is required in between logging runs. Moreover, there is always the risk of a wireline logging tool getting stuck in the hole, which could significantly add to the cost of drilling a well.

MWD or LWD tools, as the names suggest, obtain measurements while drilling in real-time. MWD tools are especially important when drilling directional wells since they give the driller information about the trajectory of the well along with information such as tool downhole vibration, and gamma ray tool internal temperature. LWD tools on the other hand obtain information about the geological properties of the well and can be added to a bottom hole assembly depending on the formation evaluation requirements, such as resistivity, density etc. for the primary purpose identifying potential hydrocarbon bearing zone. The signals from the MWD or LWD tools are communicated to the surface by mud pulse telemetry and are recorded at the surface by pressure transducers, which are decoded immediately. MWD or LWD are very expensive, bulky and lengthy tools and mud pulse rate is generally slow (maximum of up to 20 bits or second in the field). The power to the MWD or LWD tools and the mud pulse telemetry unit is provided by batteries and recently by a downhole turbine or alternator. The power generation turbine, if installed close to the mud pulser and above the LWD tool, may prevent the retrieval of radioactive chemical sources in the LWD tool if the drilling bottom-hole assembly gets stuck and cannot be retrieved. It should be pointed out that the MWD or LWD tools are typically placed 35-60 feet away from the drill bit. Therefore, the driller does not have any information about the downhole environment at the bit.

Sometimes drillers 'drill in the dark' due to their inability to see the trajectory of the well and the downhole environment. What makes drilling more challenging is that once drilling tools or instruments or devices are lowered into a well they are inaccessible from the surface. Conventional techniques to control these tools or instruments or devices from the surface include mechanical methods, such as applying weight-on-bit ("WOB") and rotating the drill string assembly, applying pressure and dropping balls, or hydraulic methods such as fluid pressure cycles and flowing pressure cycles. However, mechanical and hydraulic methods may introduce certain restrictions and potential challenges or issues to the drilling process.

SUMMARY

More recently radio frequency identification (RFID) based systems have been developed for drilling applications. RFID tags programmed with a unique code at the surface are dropped into wells and travel downhole with the drilling fluid flow. Downhole tools or instruments or devices such as bypass valves, reamers or packers are integrated with an RFID reader. The RFID reader consists of a battery, electronics, and an antenna encapsulated for protection. The RFID tags are energized by the antenna of the reader when they are in the vicinity of each other. The antenna constantly generates an RF field to 'listen' to RFID tags. The readers have the ability to only respond to a specific identification code and to ignore other codes, and also to eliminate repetition of operations by only accepting a unique code once. The biggest advantage RFID-based systems have is that they place no restrictions on the inner diameter of the drill string compared to the procedure normally used for activating bypass valves, which involves dropping an activation ball to open the two side ports. An additional two balls are dropped to close the ports. Applying pressure from the surface releases all three balls that fall into a ball catcher cage below. RFID systems enable remote activation and places no restrictions inside the drill string, resulting in a larger flow area for the drilling fluids, and allowing any logging instrument to pass through the drill string without restriction. This also results in reducing the risk of lost circulation material (LCM) damaging the MWD unit or tools below the bypass valve, which can be used to perform multiple operations at one depth or several depths with bypass valves placed at one location or multiple locations on the drill string, and avoids extra trips to the surface to remove the balls or reamer from the drill string assembly.

An effective method to actuate downhole tools or instruments or devices from the surface not only allows the redesign of workflows to increase drilling efficiency but can also facilitate drilling automation by closing one of the key technology gaps, communicating with and delivering trigger signals to downhole actuation systems in real-time.

Accordingly, one embodiment is a downhole actuation system that can be controlled from the surface to actuate digitally enabled downhole devices or tools or instruments (collectively referred to as "devices"). Actuation of different devices enables the execution of discrete drilling workflows. The actuation system can be seamlessly integrated with downhole devices so it does not displace existing drilling portfolios. The system includes a first cylindrical pipe having one or more first materials attached to an outer surface of the first cylindrical pipe, a second cylindrical pipe co-axial with the first cylindrical pipe and having a diameter greater than the first cylindrical pipe, the second cylindrical pipe including one or more second materials disposed on an inner surface of the second cylindrical pipe, wherein the first materials generate one or more signals when the first materials come in contact with the second materials, and one or more downhole devices placed along a drill string inside a well for being activated, deactivated, or configured by the downhole actuation system. The system further includes a digital logic circuit configured to receive the one or more signals as input, and generate an output based on the input, the output configured for actuation of the downhole devices.

Another embodiment is a method for downhole actuation that can be controlled from the surface to actuate digitally enabled downhole devices. Actuation of different devices enables the execution of discrete drilling workflows. The actuation system and methods not only allow the redesign of workflows to increase drilling efficiency but can also facilitate drilling automation by closing one of the key technology gaps, communicating with and delivering trigger signals to downhole actuation systems in real-time. The method includes providing a first cylindrical pipe having one or more first materials attached to an outer surface of the first cylindrical pipe, providing a second cylindrical pipe co-axial with the first cylindrical pipe and having a diameter greater than the first cylindrical pipe, the second cylindrical pipe including one or more second materials disposed on an inner surface of the second cylindrical pipe, wherein the first materials generate one or more signals when the first materials come in contact with the second materials. The method further includes placing one or more downhole devices along a drill string inside a well for being activated, deactivated, or configured by the one or more signals. The method also includes receiving, by a digital logic circuit, the one or more signals as input, and generating an output based on the input, the output configured for actuation of the downhole devices.

BRIEF DESCRIPTION OF DRAWINGS

The foregoing aspects, features, and advantages of embodiments of the present disclosure can further be appreciated when considered with reference to the following description of embodiments and accompanying drawings. In describing embodiments of the disclosure illustrated in the appended drawings, specific terminology can be used for the sake of clarity. However, the disclosure is not intended to be limited to the specific terms used, and it is to be understood that each specific term includes equivalents that operate in a similar manner to accomplish a similar purpose.

For simplicity and clarity of illustration, the drawing figures illustrate the general manner of construction, and descriptions and details of well-known features and techniques may be omitted to avoid unnecessarily obscuring the discussion of the described embodiments. Additionally, elements in the drawing figures are not necessarily drawn to scale. For example, the dimensions of some of the elements in the figures may be exaggerated relative to other elements to help improve understanding of the embodiments. Like reference numerals refer to like elements throughout the specification.

DETAILED DESCRIPTION

The methods and systems of the present disclosure can now be described with reference to the accompanying drawings in which embodiments are shown. The methods and systems of the present disclosure may be in many different forms and should not be construed as limited to the illustrated embodiments set forth; rather, these embodiments are provided so that this disclosure can be thorough and complete, and can fully convey its scope to those skilled in the art. The term "high temperature" refers to temperatures above 125° C. unless otherwise noted.

Figure 1:
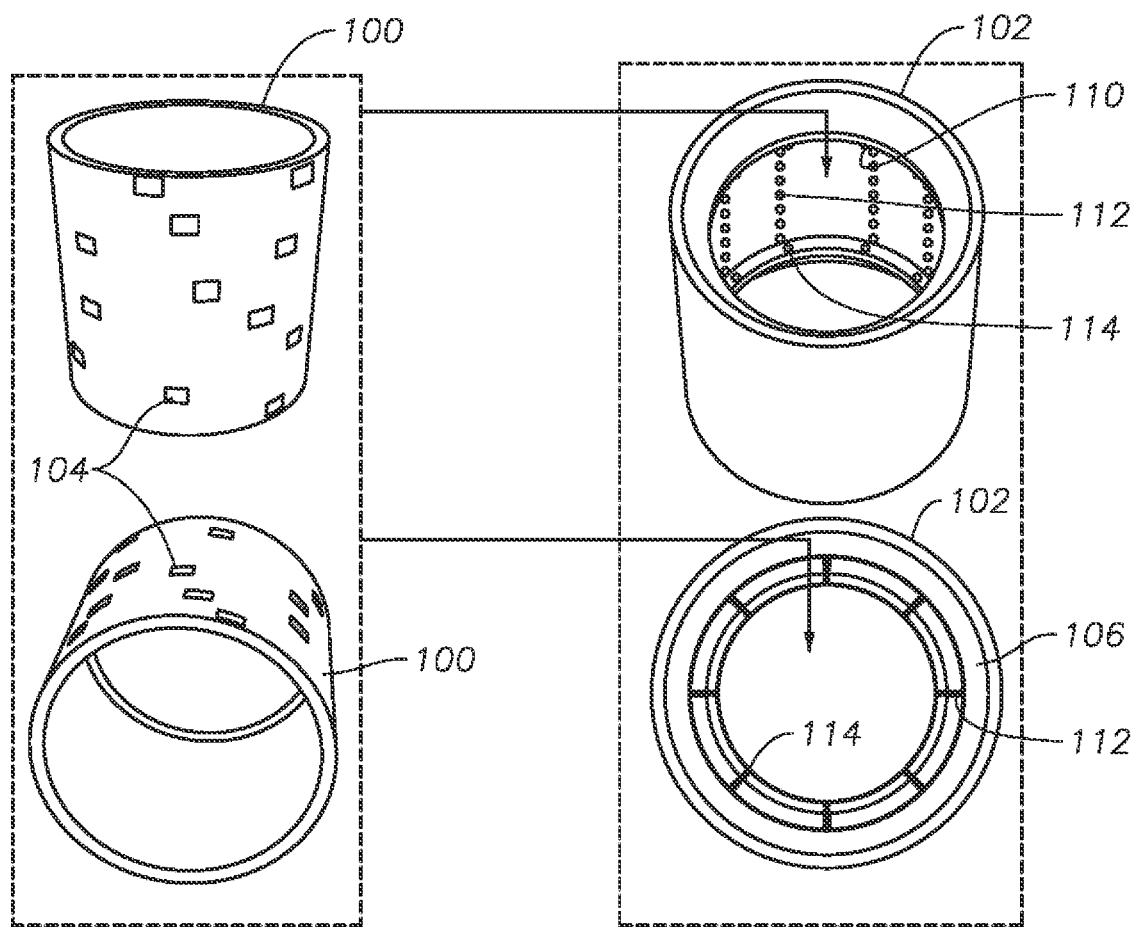
FIG. 1 is a schematic of a component of a downhole actuation system that can be controlled from the surface to actuate digitally enabled downhole devices, according to one or more example embodiments.
Figure 1:
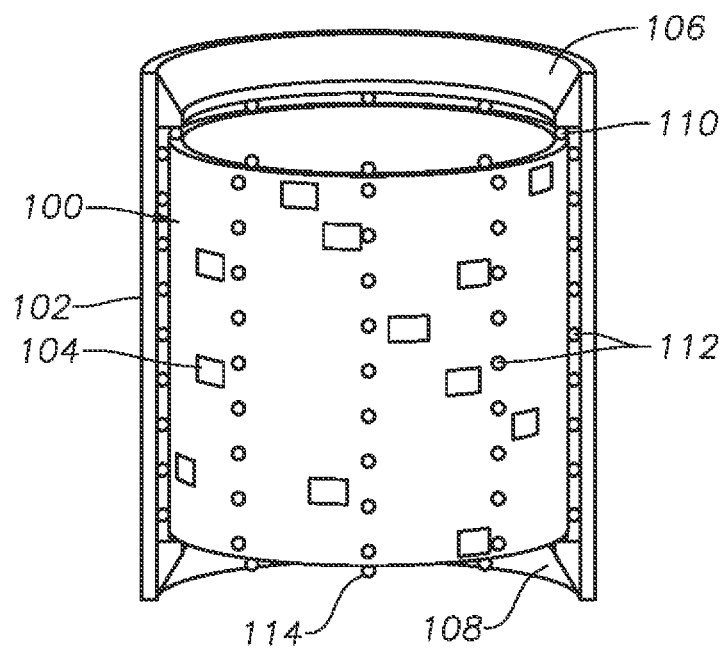

FIG. 1 is a schematic of a component of a downhole actuation system that can be controlled from the surface to actuate digitally enabled downhole devices, according to one or more example embodiments. The downhole actuation system includes two pipes, pipe 100 and pipe 102, as shown in FIG. 1. Pipe 100 has segments 104 coated or embedded around its outer surface and pipe 102 has rows of ball bearings 112 on the inner surface, on the top and bottom end surfaces. The actuation system has pipe 100 installed inside pipe 102 so that the side ball bearings 112 on pipe 102 are in contact with the segments 104 on pipe 100. Pipe 100 may be sandwiched between the top and bottom ball bearings 110, 114 of pipe 102, where the top and bottom ball bearings 110, 114 are connected to pipe 102 by a supporting structure 106, 108.

Figure 2:
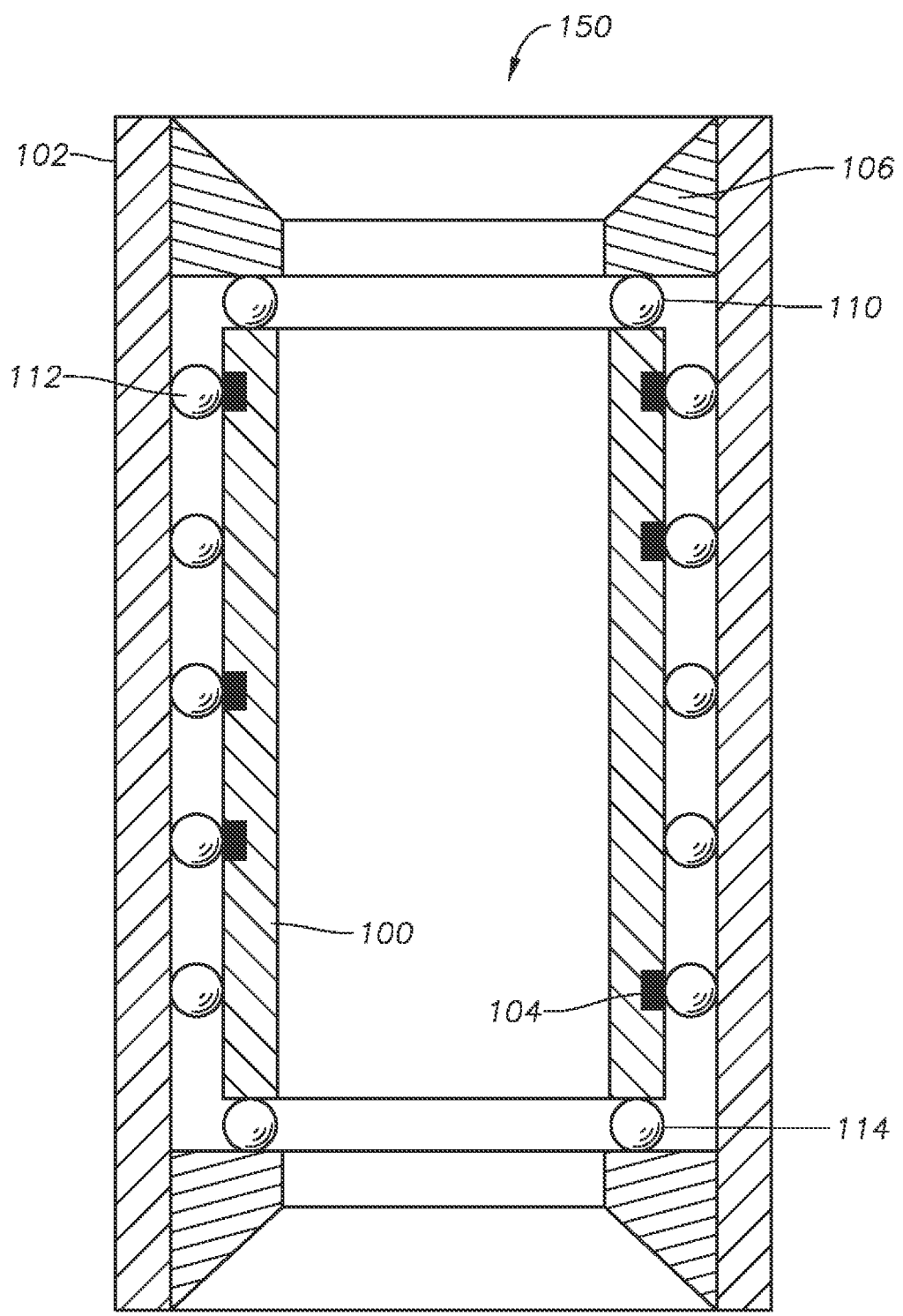
FIG. 2 is a schematic of a component of a downhole actuation system that can be controlled from the surface to actuate digitally enabled downhole devices, according to one or more example embodiments.

FIG. 2 shows a cross-section of a component 150 of a downhole actuation system, according to one or more example embodiments. In this embodiment, outer pipe 102 may be connected to a drilling assembly so that pipe 102 rotates around pipe 100, which is installed inside pipe 102. The ball bearings 110, 112, 114 have negligible friction so that pipe 100 remains stationary while pipe 102 rotates with the drilling assembly. During rotation pipe 102 side ball bearings 112 move over and along the surface of the segments 104 on pipe 100. Over the course of a drilling operation the side ball bearings 112 of pipe 102 can move over and along the segments 104 of pipe 100 multiple times. The inner diameter of the drill string assembly is only minimally reduced due to the side bearings 112 and the thickness of pipe 100.

Figure 3:
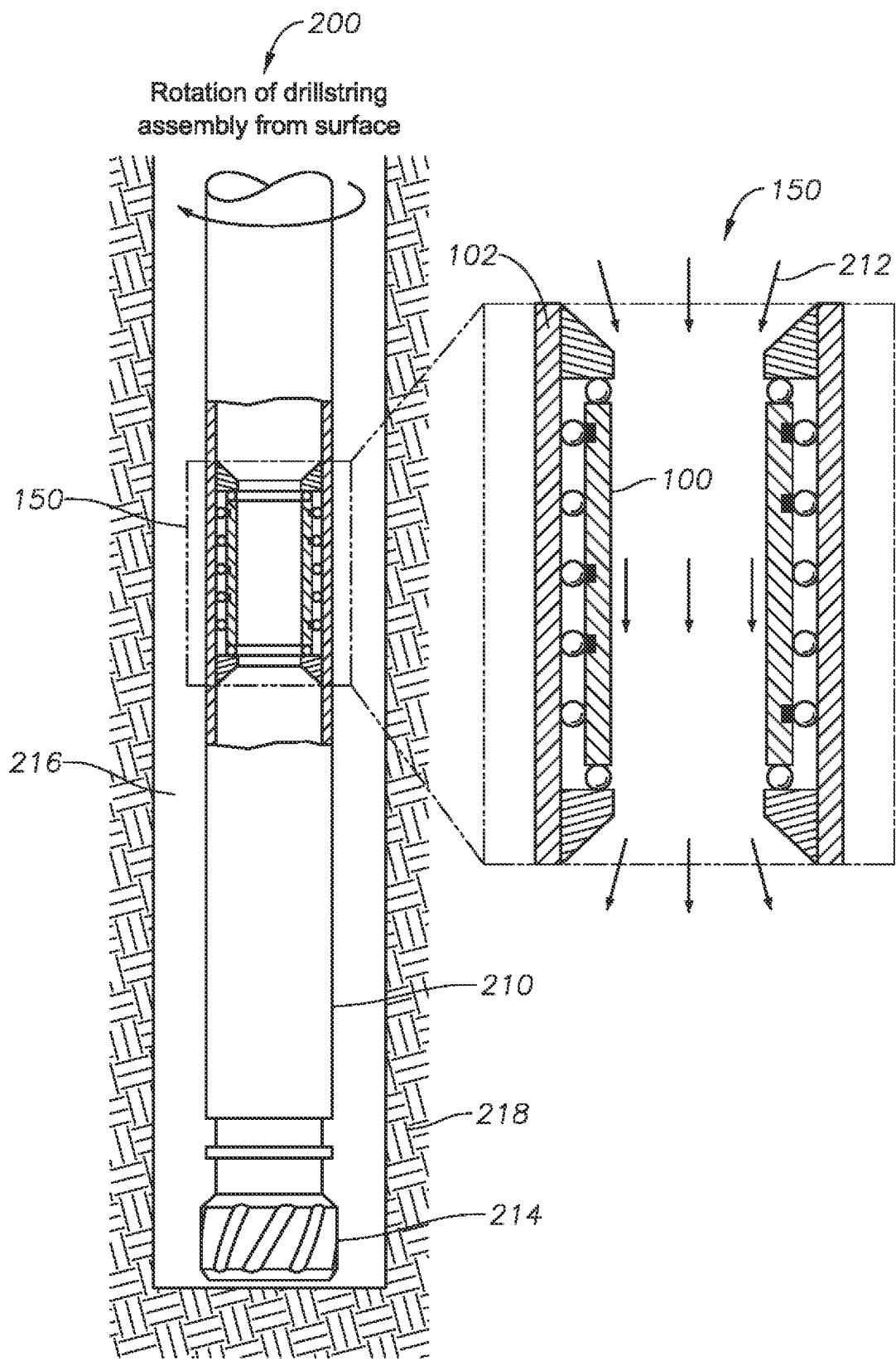
FIG. 3 is a schematic of a downhole actuation system that can be controlled from the surface to actuate digitally enabled downhole devices, according to one or more example embodiments.

FIG. 3 illustrates a drilling system 200 where the downhole action system 150 is attached to a drill string assembly 210. The actuation system 150 can be connected as a drilling sub in a drill string assembly 210 or can be attached as a separate structure. The drilling fluid 212 flows through the drill string assembly 210, out the drill bit 214, up the annulus 216, which is the space between the outer diameter of the drill string assembly 210 and the downhole formation 218 being drilled through, and back up to the surface.

Figure 4:
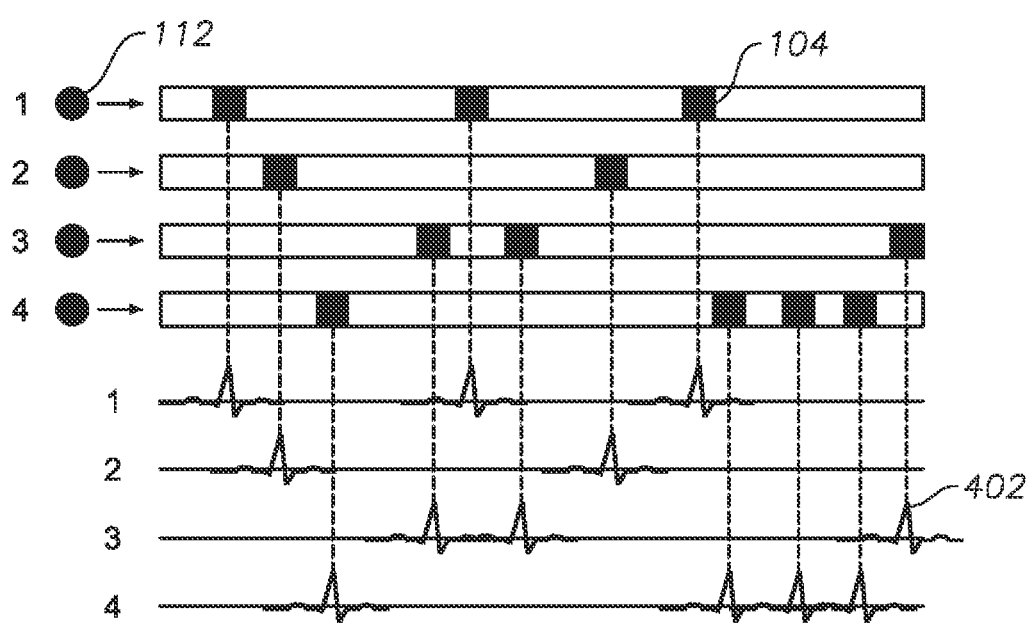
FIG. 4 illustrates an example method for downhole actuation of digitally enabled downhole devices, according to one or more example embodiments.

As illustrated in FIG. 4, segments 104 may be coated in a specific configuration around pipe 100, which corresponds to signal patterns required to trigger or convey a specific command or instruction to a digitally enabled downhole tool or instrument or device. The information stored in the configuration of segment 104 arrays around pipe 100 are transferred as specific codes to the downhole tool or instrument or device when pipe 102 rotates around pipe 100. In one embodiment, the side ball bearings segments 112 on pipe 102 are made from material A and the segments 104 on pipe 100 are made from material B, where material A and material B have opposite polarity or polarities as distant as possible to each other. Each time a side ball bearing 112 moves over and along a segment 104, it gives rise to a voltage peak 402 as shown in FIG. 4. It should be noted that the amplitude and shape of the peak 402 in FIG. 4 are only to explain the method and can be different depending on the size, shape of side ball bearings and segments, as well as the speed and frequency of rotation. The voltage peaks 402 are generated due to the exchange of charge between material A and material B. Some materials are more inclined to gain electrons and some to lose electrons. Electrons can be injected from material B into A if material A has a higher polarity than material B, resulting in oppositely charged surfaces. Materials A and B can be made of materials such as, Polyamide, Polytetrafluoroethylene (PTFE), Polyethylene terephthalate (PET), Polydimethylacrylamide (PDMA), Polydimethylsiloxane (PDMS), Polyimide, Carbon Nanotubes, Copper, Silver, Aluminum, Lead, Elastomer, Teflon, Kapton, Nylon or Polyester.

Other methods to generate voltage peaks may also be employed. For example, the segments 104 can be made from piezoelectric materials such as quartz, langasite (lanthanum gallium silicate), lithium niobate, titanium oxide, or any other material exhibiting piezoelectricity. In this case the piezoelectric segments 104 are stressed when the side ball bearings 112 move over and along their surfaces. This mechanical stresses experienced by the piezoelectric materials generate electric charges resulting in voltage peaks. The constant motion due to the rotation of the drill string assembly while drilling enables the piezoelectric segments to go through the motions of being stressed and released and generate voltage peaks. Another method of generating voltage peaks is by having the segments 104 made by a magnetostrictive material such as Terfenol-D, Galfenol, Metglas or any other material that show magnetostrictive properties. The stress applied to the magnetostrictive segments 104 when the side ball bearings 112 move over and along them results in a change in the magnetic field of the magnetostrictive material. This induced magnetic field can be converted to a voltage by a planar pick-up coil or a solenoid that can be fabricated with the segment 104.

Figure 5:
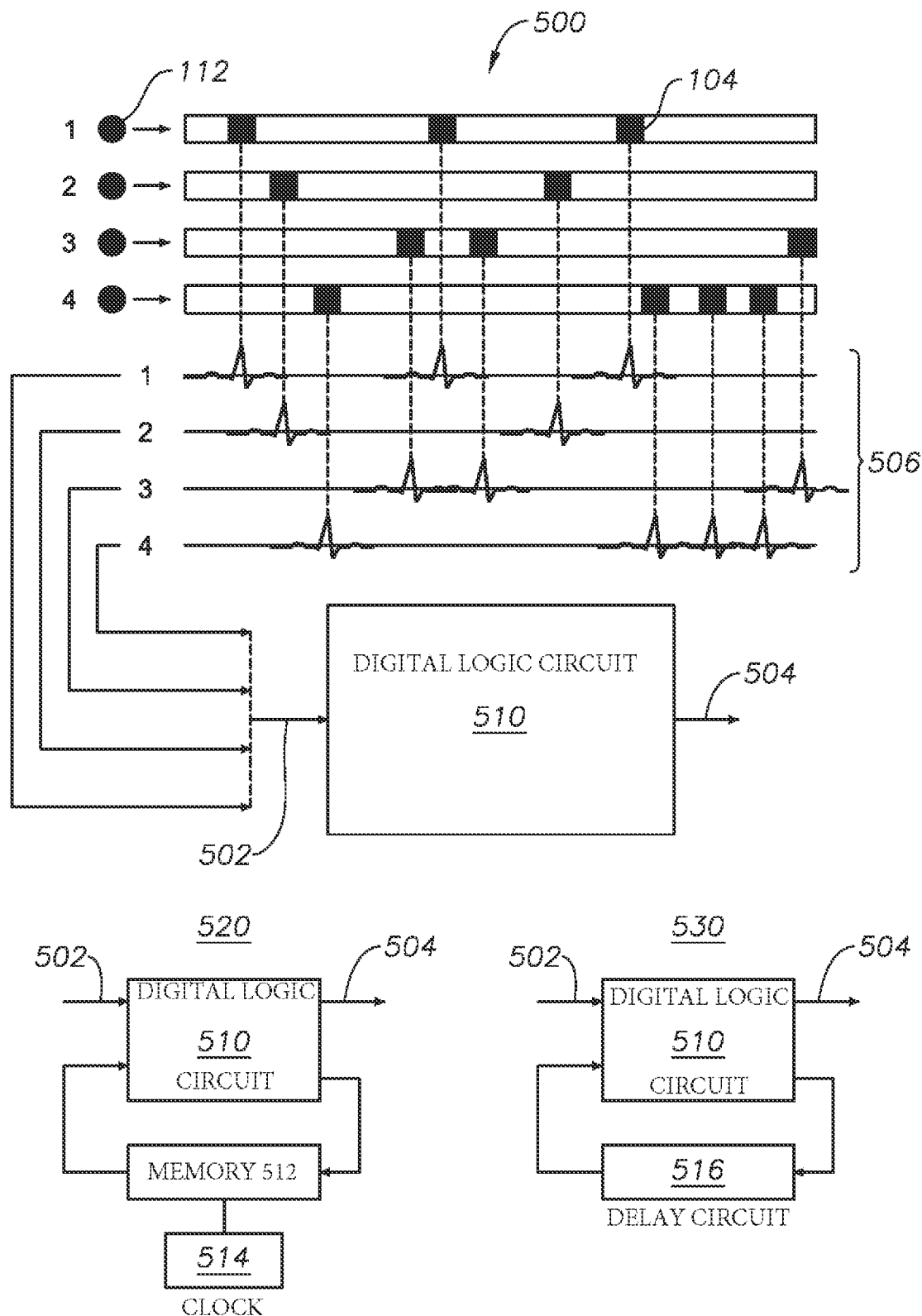
FIG. 5 is a schematic of a downhole actuation system that can be controlled from the surface to actuate digitally enabled downhole devices, according to one or more example embodiments.

FIG. 5 illustrates another component 500 of the downhole actuation system, according to one or more embodiments. In this component, the continuous signal patterns 506 generated, with voltage peaks due to side ball bearings 112 moving over and along segments 104, and periods of no voltage when the side ball bearings 112 rotating around the outer surface of pipe 100, are converted to digital signals by an analog-to-digital converter and connected as inputs 502 to a digital logic circuit (DLC) 510, as shown in FIG. 5. The DLC 510 is a sequential logic circuit, where the output 504 is not only a function of the inputs 502 but also a sequence of past inputs. Therefore, sequential circuits have state or memory and this feature can be utilized to design downhole digital actuation systems.

In one embodiment, the actuation system provides the control signal to downhole tools or instruments or devices, which convert the energy from the signal into some form of motion, such as opening or closing a valve. The sequential logic circuits can be synchronous 520, asynchronous 530 or a combination of both. Synchronous sequential circuits 520 have one or more clocks 514 connected to the inputs of all the memory elements 512 of the circuit, which generate a sequence of repetitive pulses to synchronize all internal changes of state. There are two types of sequential circuits, pulsed output and level output. In pulsed output circuits the output remains the same throughout the duration of an input pulse or the clock pulse for clocked sequential circuits. In level output sequential circuits, the output changes state at the initiation of an input or clock pulse and remains in that state until the next input or clock pulse. Asynchronous sequential circuits 530 do not have a periodic clock and the outputs change directly in response to changes in inputs. Asynchronous sequential circuits 530 are faster since they are not synchronized by a clock and the speed to process the inputs is only limited by the propagation delays 516 of the logic gates used in the circuit. The digital logic circuits 520, 530 can be implemented as an integrated circuit (IC) such as a field-programmable gate array (FPGA), application-specific integrated circuit (ASIC), complex programmable logic device (CPLD) or system on a chip (SoC).

Figure 6:
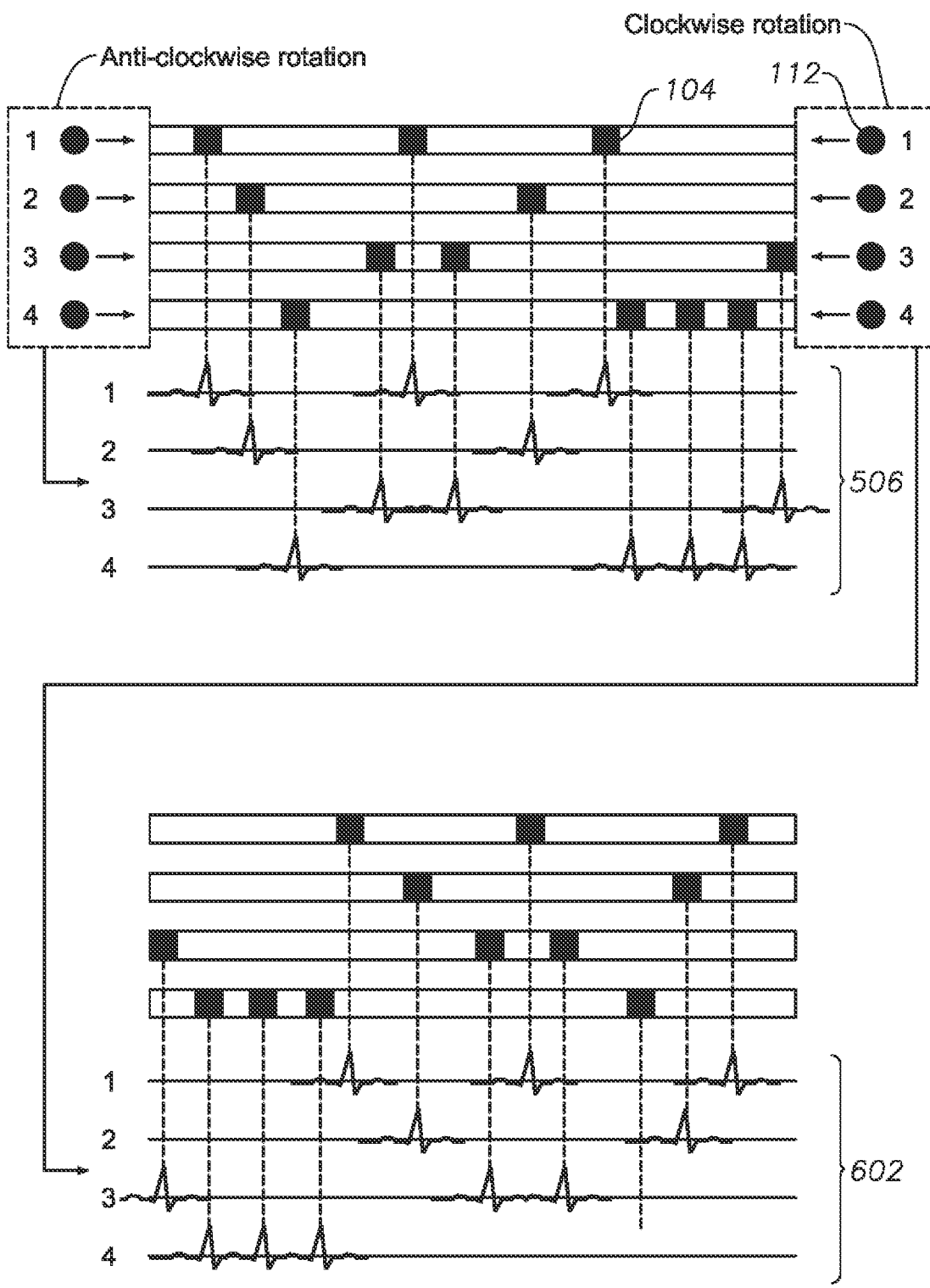
FIG. 6 illustrates an example method for downhole actuation of digitally enabled downhole devices, according to one or more example embodiments.

As illustrated in FIG. 5, during the drilling process signals 506 can have the same sequences with peak voltage amplitudes followed by periods of zero or very low voltage since the drill string assembly is rotating in the same direction, anticlockwise, at approximately the same speed. The digital logic circuit 510 compares the signal sequences over a given time period or frame or slot, clock cycle or fixed set of rotations and makes a decision to enable, disable or perform no action. The actuation system can be programmed to perform no action if the signal patterns are the same over the comparison period. However, if the direction of rotation is changed from anticlockwise to a clockwise direction, as shown in FIG. 6, then the sequence of signals changes. This feature of the actuation system can be utilized to develop unique code sequences to actuate a variety of downhole tools or instruments or devices and execute many discrete drilling workflows. More importantly, the actuation system can be controlled from the surface. For example, the drilling process results in the side ball bearings 112 moving along and over the segments 104 in an anticlockwise direction. If the sequence has to be changed to actuate a downhole tool or instrument or device, then drilling can be ceased, the drill bit can be lifted off the bottom of the well and the drill string assembly can be rotated from the surface in a clockwise direction. The clockwise direction generates a sequence 602 that is different from the sequence 604 produced in an anticlockwise direction while drilling. The digital logic circuit 510 in the actuating system recognizes the difference in the signal sequence patterns and sends a control signal to the downhole tool or instrument or device to perform the appropriate action. When the drill bit is off the bottom of the well, the drill string assembly can be rotated anticlockwise or clockwise to generate a large number of signal sequence patterns that can be translated into some form of motion in the downhole tool or instrument or device. Additionally, there can be multiple actuating systems, with unique segment patterns, placed at one or various locations in the drill string assembly. As a result, a large number of downhole tools or instruments or devices can be controlled and triggered from the surface. As code sequences are unique to a specific downhole tool or instrument or device or operation, discrete drilling workflows can be executed without affecting other downhole tools or instruments or devices or operations. Drilling efficiency can also be optimized by redesigning workflows to increase drilling efficiency.

Another method of generating unique sequences is by changing the frequency of the rotation of the drill string assembly in both or either anticlockwise or clockwise directions over one or multiple cycles. The rotation speed can be i) increased and then decreased or decreased and increased in one direction, ii) increased in the anticlockwise direction and decreased in the clockwise direction, iii) increased in the clockwise direction and decreased in the anticlockwise direction, iv) any combination of increase or decrease in anticlockwise or clockwise directions.

The size and shape of the segments can also be changed to generate signals of different amplitudes, widths, and shapes. These signal patterns can then be used to identify the direction of rotation of the drill string assembly. In such a case the digital logic circuit can recognize the direction of rotation and initiate action to actuate downhole tools or instruments or devices after a specific number of rotations. The digital logic circuit can also compare rotation directions over a specific number of rotations and trigger downhole tools or instruments or devices.

Figure 7:
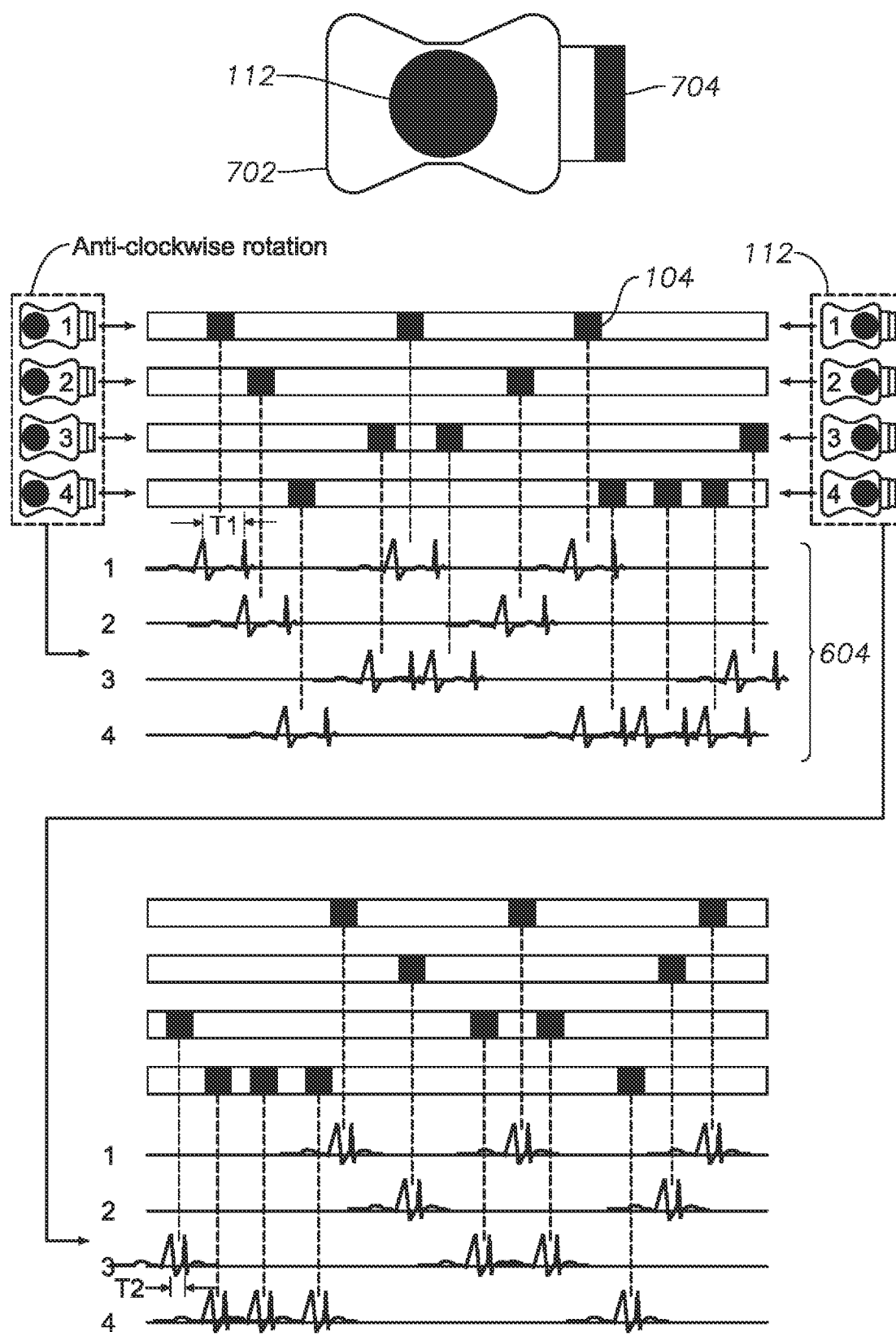
FIG. 7 illustrates an example method for downhole actuation of digitally enabled downhole devices, according to one or more example embodiments.

Another method to distinguish the direction of rotation is to place the side ball bearings 112 in a latch slot 702, as shown in FIG. 7. The side ball bearings 112 shift to the side of the latch slot 702 relative to the direction of angular acceleration created by the drill string rotation. On one side of the latch slot 702 is a cylindrical roller bearing 704, for example an ID bearing, which acts as a unique identifier. When the drill string assembly is rotating in an anticlockwise direction the side ball bearings 112 are driven to the left of the slot 702 and to the right when the drill string is rotating in a clockwise direction. The presence of the smaller ID bearing results in a peak of shorter width as the ID bearing is in contact with the segment 104 for a shorter duration. When the drill string assembly is rotating in an anticlockwise direction the side ball bearing 112 is further away from the ID bearing compared to when the drill string assembly is rotating in the clockwise direction. Therefore, when the drill string is rotating in an anticlockwise direction the time difference T1 between the peak due to the side ball bearing 112 moving up and along a segment 104 and the peak due to the ID bearing moving up and along the segment 104 is larger than the time difference T2, when the drill string is rotating in a clockwise direction. The resulting sequences are not only different due to rotating in opposite directions but they also have unique IDs, T1 and T2, that can be utilized to identify the direction of rotation.

Figure 8:
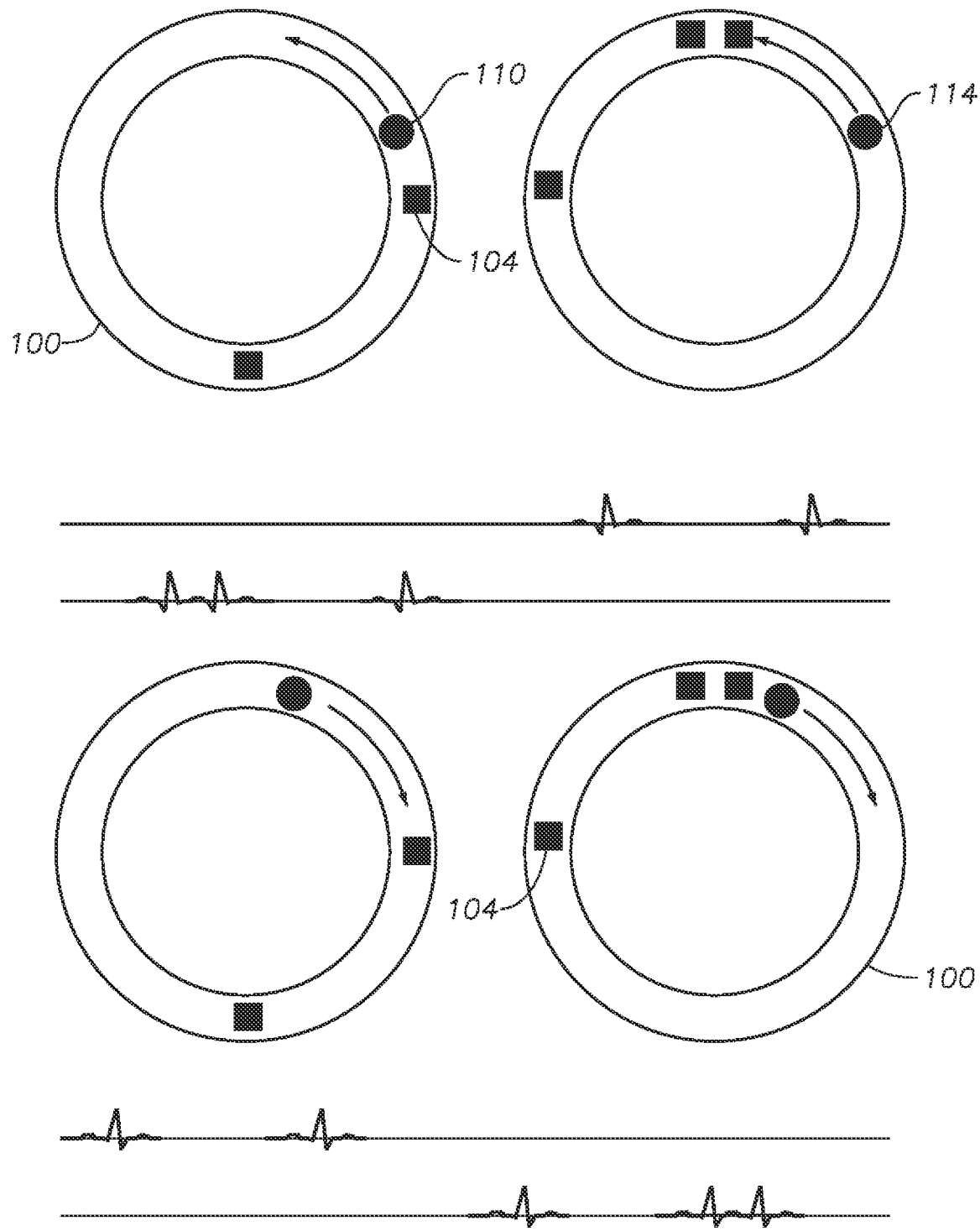
FIG. 8 illustrates an example method for downhole actuation of digitally enabled downhole devices, according to one or more example embodiments.

Unique IDs can also be generated by having segments 104 on the top and bottom of pipe 100, as shown in FIG. 8. The top and bottom section of pipe 100 are sandwiched between the top and bottom bearings of pipe 102. Segments 104 can be coated on the top and bottom of pipe 100 so that when the drill string assembly rotates the top and bottom bearings 110 of pipe 102 move along and over the segments 104 on the top and bottom of pipe 100. The generated sequences when the drill string assembly is rotating in anticlockwise and clockwise directions are different and can also be used as an additional method to uniquely identify the direction the drill string is rotating along with the methods explained with respect to FIGS. 4-7. It should be noted, however, that the segment and ID bearing patterns shown in FIGS. 4-8 are only examples and there are many combinations of patterns that can be utilized to generate unique sequences. Additionally, generation of signal sequences does not require a power source such as a battery.

Figure 9:
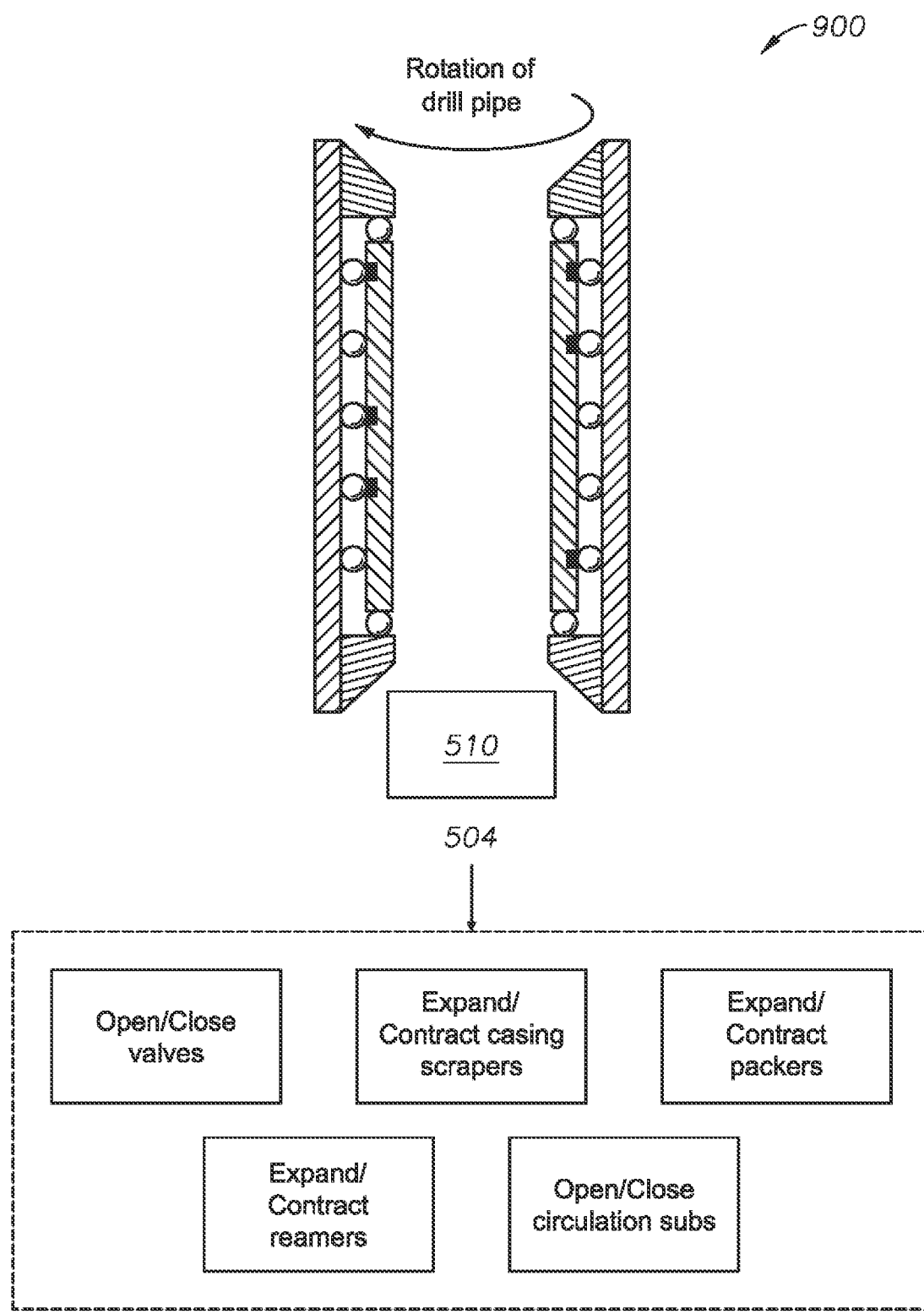
FIG. 9 illustrates an example operations that can be performed using the downhole actuation system, according to one or more example embodiments.

The actuating system described above can be controlled from the surface and utilized for a number of downhole operations on a drilling rig, as shown in FIG. 9, for example. These operations are collectively referred to herein as operations performed by "digitally enabled downhole devices." Actuating downhole circulation subs to facilitate drilling and wellbore cleaning operations is one example. The actuating system can be used to send a trigger signal to open the circulation sub by sliding a sleeve or opening a valve to divert the drilling fluid directly into the annulus. This operation increases drilling fluid flow in the annulus and aids wellbore cleaning and can also split flow between the annulus and the drill string assembly. Once the operation is completed another trigger signal can be sent to close the circulation sub. Actuating bypass valves at a selected depth below fractures and pump lost circulation material through them to plug the fractures is another example. After the operation instructions can be conveyed from the surface through the actuating system to close the valves immediately after a certain period of time. Similar operations can be performed to change the drilling fluid or pump cement into the wellbore at desired depths. Also, the actuating system can be utilized to activate or deactivate flapper valves and stimulation sleeves.

Actuating drilling reamers for increasing the size of the wellbore below casing is another example. A drilling under-reamer is a tool with cutters that is located behind a drill bit. It is utilized to enlarge, smoothen and condition a wellbore for running casing or completion equipment without any restrictions. Rather than pulling the drill string assembly out of the well when problems arise downhole, a reamer can be activated by the actuating system. The under-reamer then extends and drills through with the drill bit. Another trigger signal can be sent from the surface to retract the under-reamer. The actuating system can be programmed to extend or retract reamers in several finite steps depending on the desired diameter of the wellbore.

Expanding and retracting casing scrapers is another example. Casing scrapers are utilized to remove debris and scale left by drilling fluids on the internal casing. Casing scrapers can be run with a drilling assembly in retracted mode while drilling an open-hole section. The scrapers can be expanded any time, for example when tripping out of hole, to scrape internal casing or critical zones in internal casing. The actuating system can also be utilized to expand and contract inflatable and production or test packer. Expanded packers seal the wellbore to isolate zones in the wellbore and also function as a well barrier. In the case of production or test packers they are set in cased holes while inflatable packers are set in both open and cased holes. Sending command signals from the surface via the actuating system to set liner hangers is another example.

Figure 10:
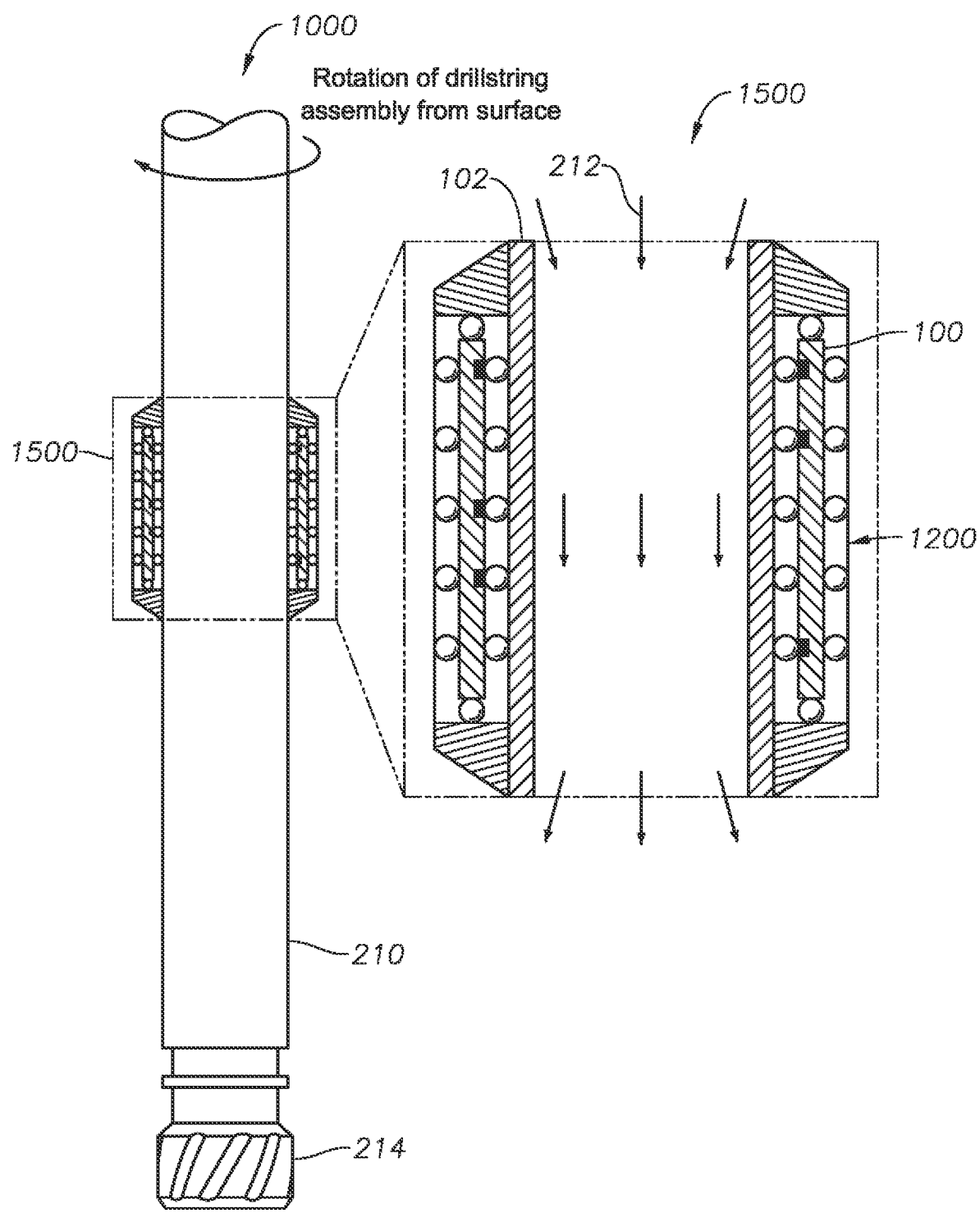
FIG. 10 is a schematic of a downhole actuation system that can be controlled from the surface to actuate digitally enabled downhole devices, according to one or more example embodiments.

FIG. 10 illustrates another downhole actuation system 1000, according to one or more example embodiments. In this embodiment, the actuating system 1500 can be installed outside a drill string assembly 210, as shown in FIG. 10. Pipe 100 may be installed outside of pipe 102, and bearings 112 can be disposed in a sleeve 1200 formed around the outer surface of pipe 102. It is important to note that charges are constantly being produced due to the ball bearings moving over and along segments, especially while drilling. Therefore, these charges can also be converted from an analog signal to a digital signal by a bridge rectifier and stored in a di-electric capacitor de-rated for use at high temperatures, a ceramic, an electrolytic or a super capacitor. By storing the energy in a capacitor the actuating system can also act as a power source.

Figure 11:
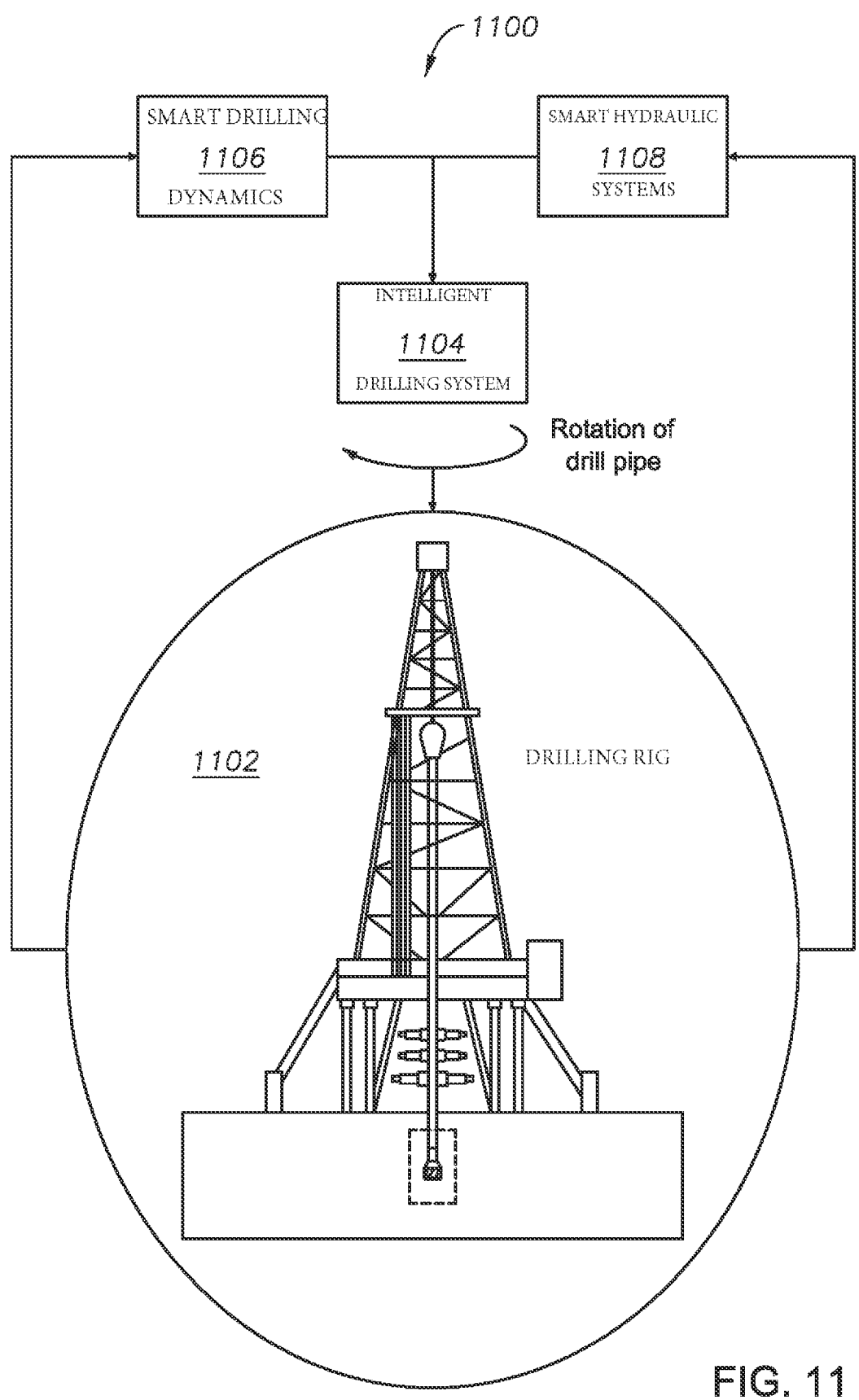
FIG. 11 is a schematic of a downhole actuation system that can be controlled from the surface to actuate digitally enabled downhole devices, according to one or more example embodiments.

Fourth industrial revolution (referred to as "4IR") technologies such as artificial intelligence, machine learning, big data analytics, and robotics are progressing at a very rapid rate. According to one embodiment, human intervention to control the downhole actuation device in a drilling rig 1102 can be replaced by an intelligent system 1100, as shown in FIG. 11. The intelligent system 1100 performs optimized drilling operations based on smart drilling dynamics 1106 and smart hydraulic systems 1108. For example, raw data from the various sensors on a rig can be extracted, analyzed and turned into useful information by the smart drilling dynamics 1106 and hydraulics system 1108. If a wellbore needs to be cleaned based on the data received then this can be conveyed to the intelligent drilling system 1104, which in turn can rotate the drill pipe in the required configurations to generate specific sequences utilizing the actuating system. The sequences can then be converted to a specific trigger signal to open bypass valves to divert the drilling fluid into the annulus to increase the annular velocity and clean the wellbore.

One embodiment is a downhole actuation system that can be controlled from the surface to actuate digitally enabled downhole devices or tools or instruments. Actuation of different devices or tools or instruments enables the execution of discrete drilling workflows. The actuation system is a separate system that can be seamlessly integrated with downhole tools or devices or instruments so it does not displace existing drilling portfolios.

In one embodiment, multi-channel modules can be designed to optimize the space available in a downhole actuation system. For example, high temperature co-fired ceramic (HTCC) substrates of Alumina can used for the electronic boards. These substrates are generally plated with Cu, Ni and Au for soldering and wire-bonding. The circuit dies in these boards can be processed independently and assembled into a single device as a final step. The circuit boards can be interconnected with each other using ceramic single inline package headers on brazed pins (BeNi contacts). BeNi is commercially available and is a standard technology for high temperature packaging. HTCC packages have excellent mechanical rigidity, thermal dissipation and hermeticity, important features in harsh, high temperature applications. Silicon-on-insulator (SOI) technology can be utilized for active electronics in the system. Compared to bulk Si technology, SOI significantly reduces leakage currents and variations in device parameters, improves carrier mobility, electromigration between interconnects and dielectric breakdown strength. Silicon Carbide (SiC) based electronics has superior properties to silicon based electronics and is another candidate for harsh environment applications, which are thermally, mechanically and chemically aggressive. SiC has many polytypes but 6H and 4H (H=Hexagonal) are the two most commonly used polytypes. Silicon has a bandgap of 1.12 eV and loses its PN junction characteristics around 200-225° C. SiC on the other hand has a bandgap of greater than 3 eV and can tolerate temperatures up to 600° C. Compared with Si. SiC also has a higher melting point (1420° C. vs 2830° C.).

The system can have application-specific integrated circuits (ASICs), or field programmable gate array (FPGA) circuits. Compared to ASICs, FPGA circuits do not require layouts, masks or other manufacturing steps, has a simpler design cycle, a more predictable project cycle and field reprogrammability. FPGAs can be re-used and are cheaper than ASICs. ASICs require designs based on custom specifications. One of the main disadvantages of FPGAs is the high power consumption compared to ASICs. There is no control over power optimization in FPGAs whereas low power techniques can be used to optimize power consumption in ASICs. Static random access memory (SRAM) can be reprogrammed. Since the FPGA can be reprogrammed easily a design can be loaded into the part, tried at-speed in the system and debugged when required. This is ideal for board-level testing where the FPGA can be configured to verify the board or the components on the board. After the testing is finished the FPGA is reconfigured with the application logic. However, the main advantage of SRAM is also its main disadvantage since the IC loses its programming when the power is turned off. Therefore, SRAM based FPGAs must be reprogrammed each time power is applied so an external memory is needed for permanent storage of the program. This is not feasible when board space is at a premium like in downhole applications. Therefore, electrically erasable programmable read only memory (EEPROM) is a more feasible option when the MMD is used in downhole applications. EEPROM has slow write times but this is tolerable since the main code that is usually used at start up is only modified during development, then left alone. The EEPROM should have the capability to be configured as a serial interface. Serial interface are preferred over parallel interfaces to reduce the number of interconnections and reduce crosstalk.

Materials A and B in the downhole actuation system are required to withstand high temperatures (>125° C.) and have good stability with little or no degradation in material properties after many cycles and they should not get damaged due to shock, vibration or high pressures. Some suitable materials are Copper, Aluminum, PTFE, Teflon, Kapton, Lead, Elastomer, PDMA, or any other material that can cause static electricity, or any material with similar or better thermal, mechanical and chemical properties for downhole environments, which can also be deposited as thin films. Also, the materials should be relatively cheap if they are to be used in power generators to generate electricity for many transceivers. When choosing materials it is important to remember that they have opposite polarities or polarities as distant as possible from each other. Chemical coatings can be used to further protect the downhole actuation system and its components from the harsh downhole environment. They can be polymeric coatings, which can be used to provide a uniform and pinhole free layer on sensor and electronic boards. These coatings can withstand continuous exposure to high temperatures for long periods of time, prevents corrosion of electrodes and is an excellent dielectric. Thermal insulation significantly extends the life and durability of the sensors and electronics. An outer protective shell can shield all the components inside from the environment and can be epoxy, resin-based materials, or any material that has good thermal conductivity properties.

In one embodiment, the storage unit can be either a di-electric capacitor for use at high temperatures, a ceramic, an electrolytic or a super capacitor. By storing the energy in a capacitor, power can be provided continuously to the sensors, instrumentation and communication devices. Compared to batteries, capacitors are easier to integrate into a circuit, are generally cheaper, can be bought off the shelf and are easier to dispose. According to one example embodiment, the storage unit includes one of ceramic film capacitors, electrolytic capacitors, supercapacitors, double-layer capacitors, or pseudo-capacitors.

Although some selected embodiments are discussed above, this disclosure includes all drilling and workover operations, including activating and deactivating downhole tools or instruments or devices such as circulation subs, bypass valves, drilling reamers, casing scrapers, inflatable and test or production packers, liners, and hangers. Additionally, the embodiments described here form part of the fourth industrial revolution (4IR). This has far reaching goals applied across the upstream sector, such as remote actuation of downhole devices and automatic, minimally manned drilling platforms.

Compared to the actuating system and methods presented in this disclosure, radio frequency identification (RFID) systems have the following disadvantages: A drilling fluid flow is needed for the RFID tag to travel through the drill string assembly and towards the RFID reader to activate or deactivate downhole devices. The RFID tag must be in the correct or optimized orientation when passing through the RFID reader antenna to transmit its unique identification number and specific instructions to the reader. Once the RFID tags are dropped from the surface there is no control of the tag from the surface. Multiple RFID tags need to be deployed down the drill string for multiple activation or deactivation operations. The RFID reader antenna takes up space in the drill pipe and can also be contaminated by debris from drilling fluids. The RFID reader antenna is always ON because it has to 'listen' for an RFID tag signal. An operation cannot be ceased immediately if required as another RFID tag can have to be deployed to deactivate or reset a downhole device or tool or instrument. Activation or deactivation timings depend on the time taken for the RFID tag to reach the vicinity of the RFID reader.

The downhole actuation system described in the above embodiments can be controlled from the surface to actuate digitally enabled downhole devices or tools in real-time. By actuating different devices or tools from the surface it also enables the execution of discrete drilling workflows in real-time. The actuation system is a separate system that can be seamlessly integrated with downhole tools or devices so it does not displace existing drilling portfolios. The proposed actuation system and methods not only allows the redesign of workflows to increase drilling efficiency but can also facilitate drilling automation by closing one of the key technology gaps, communicating with and delivering trigger signals to downhole actuation systems in real-time.

The actuation system is a passive system, where rotation from the surface is used to power and convey an actuating signal to the actuable device. This also allows the digital logic circuit to be in deep sleep mode until a signal is received from the actuation system enabling an ultra-low power downhole actuation system. The positioning tool and actuation device can be part of a drilling assembly.

The Specification, which includes the Summary, Brief Description of the Drawings and the Detailed Description, and the appended Claims refer to particular features (including process or method steps) of the disclosure. Those of skill in the art understand that the disclosure includes all possible combinations and uses of particular features described in the Specification. Those of skill in the art understand that the disclosure is not limited to or by the description of embodiments given in the Specification.

Those of skill in the art also understand that the terminology used for describing particular embodiments does not limit the scope or breadth of the disclosure. In interpreting the Specification and appended Claims, all terms should be interpreted in the broadest possible manner consistent with the context of each term. All technical and scientific terms used in the Specification and appended Claims have the same meaning as commonly understood by one of ordinary skill in the art to which this disclosure belongs unless defined otherwise.

As used in the Specification and appended Claims, the singular forms "a," "an," and "the" include plural references unless the context clearly indicates otherwise. The verb "comprises" and its conjugated forms should be interpreted as referring to elements, components or steps in a non-exclusive manner. The referenced elements, components or steps may be present, utilized or combined with other elements, components or steps not expressly referenced.

Conditional language, such as, among others, "can," "could," "might," or "may," unless specifically stated otherwise, or otherwise understood within the context as used, is generally intended to convey that certain implementations could include, while other implementations do not include, certain features, elements, or operations. Thus, such conditional language generally is not intended to imply that features, elements, or operations are in any way required for one or more implementations or that one or more implementations necessarily include logic for deciding, with or without user input or prompting, whether these features, elements, and operations are included or are to be performed in any particular implementation.

The systems and methods described, therefore, are well adapted to carry out the objects and attain the ends and advantages mentioned, as well as others that may be inherent. While example embodiments of the system and method have been given for purposes of disclosure, numerous changes exist in the details of procedures for accomplishing the desired results. These and other similar modifications may readily suggest themselves to those skilled in the art, and are intended to be encompassed within the spirit of the system and method disclosed and the scope of the appended claims.

The invention claimed is:

1. A system for actuation of downhole devices, the system comprising:
   a first cylindrical pipe having one or more first materials attached to an outer surface of the first cylindrical pipe;
   a second cylindrical pipe co-axial with the first cylindrical pipe and having a diameter greater than the first cylindrical pipe, the second cylindrical pipe comprising one or more second materials disposed on an inner surface of the second cylindrical pipe, wherein the one or more first materials generate one or more signals when the one or more first materials come in contact with the one or more second materials, wherein the one or more first materials and the one or more second materials are of opposite polarity, and comprise a material that causes static electricity; and one or more downhole devices placed along a drill string inside a well for being activated, deactivated, or configured by the system for actuation of downhole devices.

2. The system according to claim 1, further comprising:
a digital logic circuit configured to receive the one or more signals as input, and generate an output based on the input, the output configured for actuation of the one or more downhole devices placed along the drill string.

3. The system according to claim 2, wherein the digital logic circuit comprises a synchronous sequential circuit or an asynchronous sequential circuit.

4. The system according to claim 1, wherein the first cylindrical pipe is disposed within a drill string assembly in a drilling rig.

5. The system according to claim 1, wherein the first cylindrical pipe is disposed outside of a drill string assembly in a drilling rig.

6. The system according to claim 1, wherein the second cylindrical pipe forms part of a drill pipe in a drill string assembly, and the one or more first materials come in contact with the one or more second materials when the drill pipe is rotated.

7. The system according to claim 1, wherein the one or more second materials comprise a ball bearing.

8. The system according to claim 7, wherein the ball bearing is disposed in a latch slot.

9. The system according to claim 8, wherein the latch slot further comprises a cylindrical roller bearing that acts as a unique identifier.

10. The system according to claim 1, wherein the one or more first materials comprise a coated segment having a predetermined pattern.

11. The system according to claim 1, wherein the actuation of downhole devices comprises at least one of opening or closing valves, expanding or contracting casing scrapers, expanding or contracting contract reamers, expanding or contracting packers, and opening or closing of circulation subs.

12. The system according to claim 5, further comprising:
a sleeve formed on an outer surface of the second cylindrical pipe, the sleeve configured to contain the one or more second materials.

13. The system according to claim 1, wherein the one or more first materials and the one or more second materials are selected from the a group consisting of Copper, Aluminum, Polytetrafluoroethylene (PTFE), Polyimide, Lead, Elastomer, Polydimethylacrylamide (PDMA), Nylon, and Polyester.

14. The system according to claim 1, wherein the one or more first materials comprise a piezoelectric material or a magnetostrictive material.

15. The system according to claim 1, further comprising one or more support structures configured to support the first cylindrical pipe.

16. The system according to claim 15, further comprising:
a plurality of ball bearings between a top surface of the first cylindrical pipe and a top support structure; and
a plurality of ball bearings between a bottom surface of the first cylindrical pipe and a bottom support structure.

17. A method for actuation of downhole devices, the method comprising:
providing a first cylindrical pipe having one or more first materials attached to an outer surface of the first cylindrical pipe;
providing a second cylindrical pipe co-axial with the first cylindrical pipe and having a diameter greater than the first cylindrical pipe, the second cylindrical pipe comprising one or more second materials disposed on an inner surface of the second cylindrical pipe, wherein the one or more first materials generate one or more signals when the one or more first materials come in contact with the one or more second materials, wherein the one or more first materials and the one or more second materials are of opposite polarity, and comprise a material that causes static electricity; and
placing one or more downhole devices along a drill string inside a well for being activated, deactivated, or configured by the one or more signals.

18. The method according to claim 17, further comprising:
receiving, by a digital logic circuit, the one or more signals as input; and
generating an output based on the input, the output configured for actuation of the one or more downhole devices along the drill string.

19. The method according to claim 18, wherein the digital logic circuit comprises a synchronous sequential circuit or an asynchronous sequential circuit.

20. The method according to claim 17, wherein the first cylindrical pipe is disposed within a drill string assembly in a drilling rig.

21. The method according to claim 17, wherein the first cylindrical pipe is disposed outside of a drill string assembly in a drilling rig.

22. The method according to claim 17, wherein the second cylindrical pipe forms part of a drill pipe in a drill string assembly, and the one or more first materials corneas in contact with the one or more second materials when the drill pipe is rotated.

23. The method according to claim 17, wherein the one or more second materials comprise a ball bearing.

24. The method according to claim 23, wherein the ball bearing is disposed in a latch slot.

25. The method according to claim 24, wherein the latch slot further comprises a cylindrical roller bearing that acts as a unique identifier.

26. The method according to claim 17, wherein the one or more first materials comprise a coated segment having a predetermined pattern.

27. The method according to claim 17, wherein the actuation of downhole devices comprises at least one of opening or closing valves, expanding or contracting casing scrapers, expanding or contracting contract reamers, expanding or contracting packers, and opening or closing of circulation subs.

28. The method according to claim 27, further comprising:
providing a sleeve on an outer surface of the second cylindrical pipe, the sleeve configured to contain the one or more second materials.

29. The method according to claim 17, wherein the one or more first materials and the one or more second materials are selected from a group consisting of Copper, Aluminum, Polytetrafluoroethylene (PTFE), Polyimide, Lead, Elastomer, Polydimethylacrylamide (PDMA), Nylon, and Polyester.

30. The method according to claim 17, wherein the one or more first materials comprise a piezoelectric material or a magnetostrictive material.

31. The method according to claim 17, further comprising providing one or more support structures configured to support the first cylindrical pipe.

32. The method according to claim 31, further comprising:
   providing a plurality of ball bearings between a top surface of the first cylindrical pipe and a top support structure; and
   providing a plurality of ball bearings between a bottom surface of the first cylindrical pipe and a bottom support structure.

* * * * *

UNITED STATES PATENT AND TRADEMARK OFFICE
CERTIFICATE OF CORRECTION

| | | |
|---|---|---|
| PATENT NO. | : 11,078,780 B2 | Page 1 of 1 |
| APPLICATION NO. | : 16/720159 | |
| DATED | : August 3, 2021 | |
| INVENTOR(S) | : Gooneratne et al. | |

It is certified that error appears in the above-identified patent and that said Letters Patent is hereby corrected as shown below:

In the Claims

In Column 13, Claim 13, Line 55 should read:
-- selected from a group consisting of Copper, Aluminum, --

In Column 14, Claim 22, Line 41 should read:
-- assembly, and the one or more first materials come in --

Signed and Sealed this
Seventh Day of September, 2021

Drew Hirshfeld
*Performing the Functions and Duties of the
Under Secretary of Commerce for Intellectual Property and
Director of the United States Patent and Trademark Office*